(12) United States Patent
Nakano

(10) Patent No.: US 8,551,892 B2
(45) Date of Patent: Oct. 8, 2013

(54) METHOD FOR REDUCING DIELECTRIC CONSTANT OF FILM USING DIRECT PLASMA OF HYDROGEN

(75) Inventor: Akinori Nakano, Tokyo (JP)

(73) Assignee: ASM Japan K.K., Tokyo (JP)

(*) Notice: Subject to any disclaimer, the term of this patent is extended or adjusted under 35 U.S.C. 154(b) by 4 days.

(21) Appl. No.: 13/191,762

(22) Filed: Jul. 27, 2011

(65) Prior Publication Data

US 2013/0029498 A1 Jan. 31, 2013

(51) Int. Cl.
- H01L 21/00 (2006.01)
- H05C 1/00 (2006.01)
- H05H 1/00 (2006.01)
- H01L 23/58 (2006.01)

(52) U.S. Cl.
USPC ............ 438/798; 427/533; 427/535; 257/632

(58) Field of Classification Search
USPC .................. 438/798; 257/632; 427/533, 535
See application file for complete search history.

(56) References Cited

U.S. PATENT DOCUMENTS

| | | | |
|---|---|---|---|
| 6,521,547 B1 | 2/2003 | Chang et al. | |
| 6,632,478 B2 * | 10/2003 | Gaillard et al. | 427/255.37 |
| 6,913,796 B2 * | 7/2005 | Albano et al. | 427/536 |
| 7,049,247 B2 | 5/2006 | Gates et al. | |
| 7,205,246 B2 | 4/2007 | MacNeil et al. | |
| 7,208,389 B1 | 4/2007 | Tipton et al. | |
| 2005/0191828 A1 * | 9/2005 | Al-Bayati et al. | 438/514 |
| 2007/0173071 A1 * | 7/2007 | Afzali-Ardakani et al. | 438/781 |
| 2011/0006406 A1 | 1/2011 | Urbanowicz et al. | |

* cited by examiner

*Primary Examiner* — Fernando L Toledo
*Assistant Examiner* — Karen Kusumakar
(74) *Attorney, Agent, or Firm* — Snell & Wilmer L.L.P.

(57) ABSTRACT

A method for reducing a dielectric constant of a film includes (i) forming a dielectric film on a substrate; (ii) treating a surface of the film without film formation, and (III) curing the film. Step (i) includes providing a dielectric film containing a porous matrix and a porogen on a substrate, step (ii) includes, prior to or subsequent to step (iii), treating the dielectric film with charged species of hydrogen generated by capacitively-coupled plasma without film deposition to reduce a dielectric constant of the dielectric film, and step (iii) includes UV-curing the dielectric film to remove at least partially the porogen from the film.

16 Claims, 2 Drawing Sheets

METHOD FOR REDUCING DIELECTRIC CONSTANT OF FILM USING DIRECT PLASMA OF HYDROGEN

BACKGROUND OF THE INVENTION

1. Field of the Invention

The present invention generally relates to a method for reducing a dielectric constant of a film, particularly to such a method for a film containing a pore generator ("porogen") using direct plasma or capacitively-coupled plasma of hydrogen.

2. Description of the Related Art

These days, technology in the field of semiconductor manufacturing equipment shows remarkable improvement, achieving high integration, high speed, and high capacity, which makes wiring more fine. The more fine wiring becomes, the higher capacity the wiring requires, especially if the wiring is configured in multiple layers. As a result, such fine wiring causes signal delay, and increases electricity consumption. To solve these problems, and to reduce the amount of required capacity, insulating films having low dielectric constant have been used for multilayer wiring.

Taking into consideration how future semiconductor manufacturing equipment will be produced, to meet demand, the dielectric constant ($\in$) should be at least lower than $\in$=2.4. To achieve this, U.S. Pat. No. 7,049,247 and U.S. Pat. No. 7,208,389, for example, disclose a method for forming low dielectric constant films with dielectric constant ($\in$) lower than $\in$=2.7. The first step in the method shown above is to mix organic silane or organic siloxane, with organic material called a "porogen". Organic silane and organic siloxane are the materials forming a basic matrix of a thin film. The porogen forms pores afterwards. The second step is to form a thin film by causing chemical reactions in plasma. Next, in the third step, the thin-film is exposed to heat or UV radiation (UV-curing) to remove the porogen so as to leave pores in the thin-film and to reduce the density of the film. As a result, the value of $\in$ should be lower than $\in$=2.7. It is expected that producing films with even lower dielectric constant can easily be achieved by adding more porogen to the film. By doing so, more porogen will be removed in the UV-curing process, and as a result, more pores will be left in the thin-film.

The method above which uses porogen in the film forming process has the benefit that it can control the value of the dielectric constant by changing the ratio between the porogen and organic silane/organic siloxane, or the conditions under the UV-curing process. On the other hand, the present inventor recognizes problems mentioned below. Since pores are created in the process of exposing a film to heat or UV radiation and removing the porogen, lower dielectric constant is expected to be achieved by adding a larger amount of porogen to the film. However, even though the size of one molecule of porogen is small, if the amount of the porogen is large, the molecules of porogen are likely to be close to each other and cause aggregation. As a result, the porogen will be removed as a lump of molecules, which forms a large pore in the film after removal. With this pore, not only can the mechanical strength of the film no longer be maintained, but also it causes obstacles in the process of producing semiconductor manufacturing equipment, because some substances such as gas, metal molecules, and liquid chemicals can easily penetrate into the pore. Further, it is expected that it is possible to achieve higher mechanical strength of the film by extending UV-curing time to the most appropriate time. However, by doing so, it also causes a greater degree of film shrinkage, which results in producing films with higher dielectric constant.

Any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

In an aspect, an object of the present invention is to provide a method which achieves a desired dielectric constant of a dielectric film according to the amount of a porogen added to the film. Some embodiments provide a method for reducing a dielectric constant of a film, comprising (i) forming a dielectric film on a substrate; (ii) treating a surface of the film without film formation; and (III) curing the film, wherein step (i) comprises providing a dielectric film containing a porous matrix and a porogen on a substrate; step (ii) comprises, prior to or subsequent to step (iii), treating the dielectric film with charged species of hydrogen generated by capacitively-coupled plasma without film deposition to reduce a dielectric constant of the dielectric film; and step (iii) comprises UV-curing the dielectric film to remove at least partially the porogen from the film. Although without being limited by a theory, when the dielectric film is treated with the charged species prior to step (iii), the capacitively-coupled plasma of hydrogen is capable of removing a porogen which is weakly coupled with a film matrix and of inhibiting aggregation of a porogen by weakening its bonding, whereas when the dielectric film is treated with the charged species subsequent to step (iii), the capacitively-coupled plasma of hydrogen is capable of removing a residual porogen or cinders of a porogen after UV-curing. In some embodiments, the dielectric constant of a film can be reduced by at least 0.1 as a result of conducting step (ii), while substantially maintaining its elastic modulus.

Some embodiments provides a technology for forming interlayer insulating films for multilayer wiring, particularly, a method of forming low dielectric constant films which maintain mechanical strength and achieve low dielectric constant without changing other film properties.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION

Figure 1:
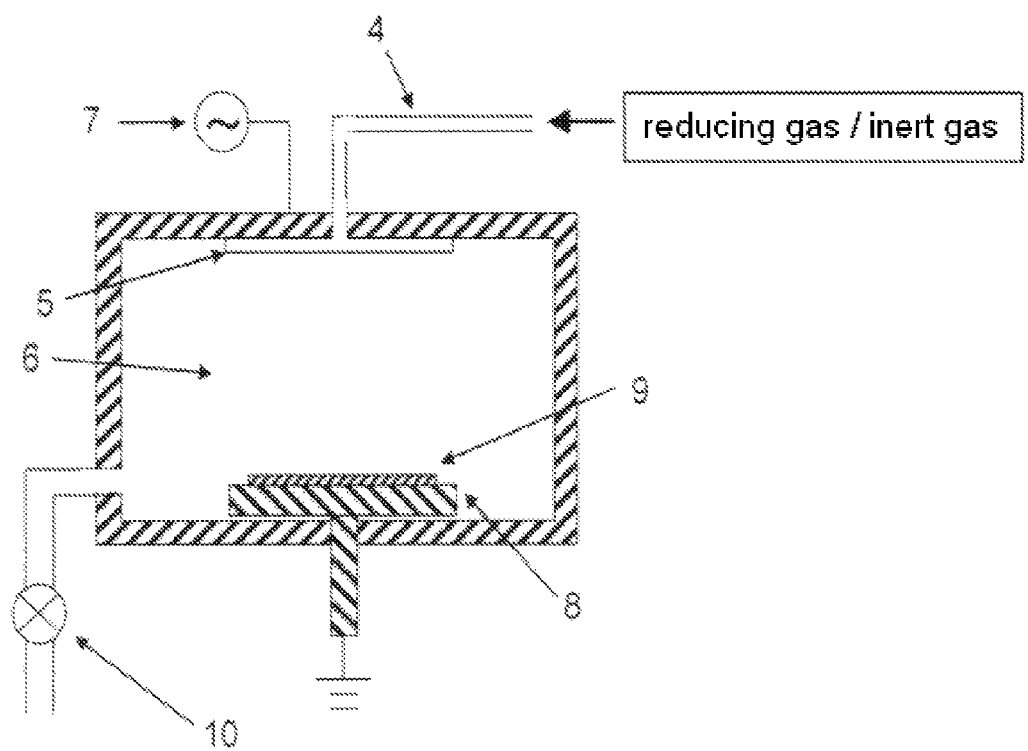
FIG. 1 is a schematic view of a plasma CVD apparatus usable in some embodiments of the present invention.

In the disclosure, "substantially the same", "substantially unchanged", or the like may refer to a difference recognized by a skilled artisan in view of the disclosure, such as a difference of less than 10%, less than 5%, less than 1%, or any ranges thereof in some embodiments. Also, in the disclosure, "substantially different", "substantially less" or the like may refer to a difference recognized by a skilled artisan in view of the disclosure, such as a difference of at least 1%, 5%, 10%, 20%, 30%, 40%, 50%, 60%, 70%, 80%, or any ranges thereof in some embodiments. Also, in the present disclosure, the numbers applied in specific embodiments can be modified by a range of at least ±50% in other embodiments, and the ranges applied in embodiments may include or exclude the endpoints. In this disclosure, "gas" may include vaporized solid and/or liquid and may be constituted by a mixture of gases. Likewise, "a" refers to a species or a genus including multiple species. In this disclosure, the porogen gas, the noble gas, and the precursor may be different from each other or mutually exclusive in terms of gas types, i.e., there is no overlap of gas types among these categories. Gases can be supplied in sequence with or without overlap. Further, in this disclosure, any two numbers of a variable can constitute an applicable range of the variable, and any ranges indicated may include or exclude the endpoints. In this disclosure, when two steps can continuously be conducted, "continuously" refers to without breaking vacuum (e.g., reduced pressure), without interruption as a timeline, without changing treatment conditions, immediately thereafter, as a next step, or without a discrete physical or chemical boundary between two structures in some embodiments. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. In this disclosure, any defined meanings do not necessarily exclude ordinary and customary meanings in some embodiments.

In the present disclosure where conditions and/or structures are not specified, the skilled artisan in the art can readily provide such conditions and/or structures, in view of the present disclosure, as a matter of routine experimentation.

As described above, in some embodiments, a method for reducing a dielectric constant of a film, comprises (i) forming a dielectric film on a substrate; (ii) treating a surface of the film without film formation, and (III) curing the film, wherein: step (i) comprises providing a dielectric film containing a porous matrix and a porogen on a substrate, step (ii) comprises, prior to or subsequent to step (iii), treating the dielectric film with charged species of hydrogen generated by capacitively-coupled plasma without film deposition to reduce a dielectric constant of the dielectric film; and step (iii) comprises UV-curing the dielectric film to remove at least partially the porogen from the film.

In some embodiments, the charged species of hydrogen is comprised predominantly or substantially of excited hydrogen radicals and hydrogen ions. In some embodiments, in step (ii), no species generated in a remote plasma unit are used for treating the dielectric film.

In this disclosure, "capacitively-coupled plasma" (CCP) refers to a plasma generated between two metal electrodes separated by a small distance, placed in a reactor where a substrate is placed, and it is also referred to as "direct plasma". Typically, CCP is driven by a single RF power supply, typically at 13.56 MHz, or power using a combination of two or more frequencies. When an electric filed is generated between electrodes, atoms are ionized and release electrons, generating excited radicals and ions. These charged species are distinguished from species generated by a remote plasma unit or aftergrow. The species generated by a remote plasma do not include ions. In some embodiments, excited hydrogen radicals and hydrogen ions are used. Hydrogen ions can penetrate deeper in a film (e.g., a depth of 300 nm or more) due to ion bombardment effect and in some embodiments, by using a combination of excited hydrogen radicals and hydrogen ions, as a synergistic effect, it is possible to effectively break the bonding of a porogen in a shorter period of time, using a smaller amount of hydrogen as compared with the use of species generated by a remote plasma unit. Since both the excited radicals and ions of hydrogen are used, and especially ions that can penetrate well, a dielectric film having a thickness which is as thick as 200 nm or more (including 250 nm, 300 nm, or more; in some embodiments, about 30 nm to about 300 nm) can be treated (the thickness is measured prior to steps (ii) and (iii)). After steps (ii) and (iii), the thickness may be reduced by about 10% to about 30%, typically about 15% to about 20%.

In some embodiments, the charged species of hydrogen is generated from a reducing gas containing hydrogen supplied over the dielectric film, to which hydrogen gas RF power is applied in-situ. In some embodiments, the RF power is about 0.7 W/cm$^2$ or less (typically about 0.1 W/cm$^2$ to about 0.6 W/cm$^2$) per area of the substrate at a temperature of about 200° C. to about 260° C. under a pressure of about 20 Pa to about 200 Pa (typically less than about 100 Pa). In some embodiments, the distance between the electrodes (the showerhead and the susceptor) is about 8 mm or more, including about 10 mm or more (e.g., less than 30 mm). In some embodiments, the reducing gas is hydrogen gas. A gas such as ammonia which supplies hydrogen after being excited by plasma can also be used.

In some embodiments, the dielectric film is treated with the charged species prior to step (iii). In some embodiments, step (i) and step (ii) are continuously conducted without breaking vacuum. In some embodiments, the dielectric film is treated with the charged species subsequent to step (iii). In some embodiments, step (i) and step (ii) are conducted in the same reaction chamber.

In some embodiments, the step of providing the dielectric film containing the porous matrix and the porogen comprises supplying a porogen gas and a precursor gas at a ratio of about 1 to about 8 of porogen gas flow to precursor gas flow (typically about 2 to about 6, or about 4 to about 6), and depositing a film on the substrate by plasma CVD. In some embodiments, promoting aggregation of porogen and reinforcing bonding of porogen can effectively be inhibited; the dielectric constant of a film can be adjusted proportionally to the amount of porogen added to the film. However, when the amount of porogen added is excessive, the mechanical strength and elastic modulus of the resultant film may suffer.

In some embodiments, the precursor gas comprises a silicon-containing gas, and the porogen gas comprises a hydrocarbon gas. In some embodiments, the dielectric film is formed of a matrix of SiCOH or SiO. In some embodiments, the film may be formed as an interlayer insulation film. The precursor may be one or more materials selected from the group consisting of diethoxylmethylsilane (DEMS), tetraethoxysilane (TEOS), dimethyldimethoxysilane, tetramethoxysilane, dimethylethoxysilane, methoxytrimethylsilane, methyltrimethoxysilane, tetramethoxysilane, methoxydimethylvinylsilane, trimethoxyvinylsilane, ethoxytrimethylsilane, ethyltrimethoxysilane, ethoxydimethylvinylsilane, diethoxydimethylsilane, diethoxymethylvinylsilane, methyltriethoxysilane, diethoxydivinylsilane, triethoxyvinylsilane, diethoxydiethylsilane, ethyltriethoxysilane, tetraethoxysilane, dimethyldipropoxysilane, hexyltrimethoxysilane, hexyloxytrimethylsilane, pentyltriethoxysilane, 1,1,3,3-tetramethyldisiloxane, pentamethyldisiloxane, hexamethyldisloxane, 1,3-dimethoxytetramethyldisiloxane, 1,3-dimethoxytetramethyldisiloxane, 1,3-divinyl-1,1,3,3-tetramethyldisiloxane, hexaethyldisiloxane, 1,3-dibutyl-1,1,3,3-tetramethyldisiloxane, hexamethylcyclotrisiloxane, 1,1,3,3,5,5-hexamethyltrisiloxane, hexaethylcyclotrisiloxane, 1,3,5-trimethyl-1,3,5-trivinylcyclotrisiloxane, 1,3,5,7-tetramethylcyclotetrasiloxane, octamethylcyclotetrasiloxane, 1,3,5,7-tetramethyl-1,3,5,7-tetravinylcyclotetrasiloxane, 1,3,5,7-tetraethoxy-1,3,5,7-tetramethylcyclotetrasiloxane, 1,3,5,7,9-pentamethylcyclopentasiloxane, decamethylcyclopentasiloxane, 1,3,5,7,9-pentaethoxy-1,3,5,7,9-pentamethylcyclopentasiloxane, dodecamethylcyclohexasiloxane, and other silane-containing precursors having methyl groups, etc. The porogen may be one or more materials selected from the group consisting of alpha-terpinene (ATRP), limonene, dipentene, alpha-phellandrene, cyclohexene, 1,2-dimethylcyclobutene, 1-methylcyclopropene, dicyclopentadiene, cyclohepta-1,3-diene, 1-5-cyclooctadiene, cyclohepta-1,3,5-triene, norbornadiene, vinylnorbornene, bicyclo[2.2.1]hepta-2,5-diene, and other hydrocarbons such as $CH_4$, $C_2H_2$, $C_2H_6$, $C_3H_4$, $C_3H_6$, $C_3H_8$, $C_4H_6$, $C_4H_8$, $C_4H_{10}$, etc. In some embodiments, an inert gas such as He, Ar, Ne, Kr, and/or Xe, can be used in addition to the precursor and the porogen gas. Also, in some embodiments, an additive gas such as $N_2O$, NO, CO, $CO_2$ and/or $O_2$ can be used in addition to the precursor and the porogen gas. In some embodiments, the step of treating the dielectric film with charged species of hydrogen generated by capacitively-coupled plasma is the only step in step (ii), wherein no remote plasma treatment is conducted additionally or alternatively. In some embodiments, steps (i), (ii), and (iii) are each conducted once.

In some embodiments, after steps (i) to (iii), the dielectric film has a dielectric constant of about 2.3 or lower, including about 2.15 or lower, and about 2.0 or lower. In some embodiments, a dielectric constant of the dielectric film is decreased by at least 0.1 (e.g., 0.1 to 0.5, including at least 0.15, 0.2, or 0.3) as a result of conducting step (ii). In some embodiments, after step (i) prior to steps (ii) and (iii), the dielectric constant may be about 2.5 or higher. In some embodiments, an elastic modulus of the dielectric film remains substantially unchanged as a result of conducting step (ii). In some embodiments, the elastic modulus after steps (i) to (iii) may be about 3.0 GPa or higher (e.g., 3.7 GPa or higher, about 5.0 GPa to about 10 GPa), and the leakage current may be less than 1.0 E-8 $A/cm^2$, typically less than 5.0 E-9 $A/cm^2$. In some embodiments, when the direct plasma treatment is conducted prior to UV-curing, the dielectric constant is substantially unchanged before and after UV-curing.

The embodiments will be explained with respect to preferred embodiments. However, the present invention is not limited to the preferred embodiments. FIG. 1 is a schematic view of a plasma CVD apparatus usable in some embodiments of the present invention. A substrate 9 (e.g., silicon wafer) is transferred to a susceptor heater 8, the temperature of which is adjusted in advance in a range of 200° C. to 260° C., typically 250° C. A reducing gas and a noble gas (e.g., inert gas or rare gas) are introduced into a reaction chamber 6 through an inflow gas line 4 and a showerhead 5. The pressure of the reaction chamber 6 is then adjusted at 20 Pa to 200 Pa, typically 20 Pa to 100 Pa, using a pressure adjusting valve 10. RF power is supplied from an RF power source 7 between the showerhead 5 and the grounded susceptor heater 8, thereby generating a plasma using the reducing gas and the noble gas which are emitted to the surface of the substrate 8. The frequency of the RF power may preferably be 13.56 MHz, the power may preferably 0.7 $W/cm^2$ or less, typically 0.6 $W/cm^2$ or less. The skilled artisan will appreciate that the apparatus includes one or more controller(s) (not shown) programmed or otherwise configured to cause the deposition and reactor cleaning processes described elsewhere herein to be conducted. The controller(s) will communicated with the various power sources, heating systems, pumps, robotics and gas flow controllers or valves of the reactor, as will be appreciated by the skilled artisan.

In some embodiments, since step (ii) can be conducted in the same chamber as in step (i), steps (i) through step (iii) can be conducted using two chambers, wherein the two chambers are connected to a wafer-handling chamber provided with a vacuum robot, to which a load lock chamber is also connected, for example.

In some embodiments, in a method of forming a dielectric film using a porogen, by treating the film with a plasma of a reducing gas or a mixture of a reducing gas and a noble gas prior to or subsequent to UV-curing, the porosity of the film can be increased, the dielectric constant can be reduced while maintaining mechanical strength of the film, and further, a leakage current can also be reduced.

In some embodiments, step (i) can be conducted under the following conditions:

Precursor Flow: about 30 sccm to about 170 sccm, typically about 60 sccm to about 140 sccm.

Porogen Flow: about 90 sccm to about 500 sccm, typically about 120 sccm to about 300 sccm.

Flow Rate Ratio of Porogen to Precursor: about 1 to about 8, typically about 2 to about 6.

Inert Gas Flow: about 200 sccm to about 2,000 sccm, typically about 400 sccm to about 1,200 sccm.

Additive Gas Flow: about 5 sccm to about 50 sccm, typically about 15 sccm to about 35 sccm.

Temperature: about 150° C. to about 350° C., typically about 200° C. to about 260° C.

Pressure: about 200 Pa to about 1,100 Pa, typically about 400 Pa to about 900 Pa.

In some embodiments, step (ii) can be conducted under the following conditions:

Hydrogen Flow: about 100 sccm to about 3,000 sccm, typically about 100 sccm to about 300 sccm, in some embodiments, less than about 400 sccm. Since excited hydrogen radicals and hydrogen ions are used in combination, hydrogen flow can be low. Even when the hydrogen flow is increased, the porogen removal effect is not expected to be promoted.

Direct Plasma Treatment Duration: about 60 seconds to about 1,200 seconds, typically about 180 seconds to about 900 seconds. Since excited hydrogen radicals and hydrogen ions are used in combination, the direct plasma treatment duration can be short. When the direct plasma treatment duration is prolonged, a film is apt to be damaged. In some embodiments, direct plasma can be applied prior to and subsequent to UV-curing, wherein the total duration of treatment should be within the above ranges.

RF Power: about 0.1 W/cm2 to about 0.7 W/cm2 per area of the substrate, typically no more than about 0.6 W/cm2.

Pressure: about 20 Pa to about 200 Pa, typically no more than about 100 Pa (lower than the pressure for depositing a film).

In step (ii), the distance between the showerhead and the susceptor ("gap") may be greater than that used for step (i), e.g., in a range of about 5 mm to about 15 mm, typically about 8 mm to 12 mm.

In some embodiments, step (iii) can be conducted under the following conditions:

UV Radiation Curing Duration: about 30 seconds to about 1,800 seconds, typically about 100 seconds to about 1,200 seconds.

UV Power: about 100 W/cm to about 120 W/cm.

UV Wavelength: about 193 nm to about 436 nm.

Temperature: about 150° C. to about 430° C., typically about 200° C. to about 400° C.

Inert Gas Flow: about 500 sccm to about 10,000 sccm, typically about 1,000 sccm to about 5,000 sccm (as inert gas, $N_2$, He, Ar, $O_2$, $CO_2$, and/or $H_2$ can be used).

EXAMPLES

The present invention will be explained with reference to preferred embodiments which are not intended to limit the present invention. In the examples where conditions and/or structures are not specified, the skilled artisan in the art can readily provide such conditions and/or structures, in view of the present disclosure, as a matter of routine experimentation. Also, in the examples, the numbers applied in specific examples can be modified by a range of at least ±50% in some embodiments.

Example 1

Using a reaction chamber for plasma enhanced CVD illustrated in FIG. 1, a film having a thickness of 250 nm was deposited on a 300-mm wafer under the following conditions:
Temperature: 250° C.;
Pressure: 800 Pa;
He: 900 sccm;
$O_2$: 25 sccm;
DEMS: 53.4 sccm to 126.8 sccm;
ATPR: 236.8 sccm to 309.1 sccm;
HRF: 1,000 W;
Distance between the showerhead and the susceptor: 8 mm.

UV-curing was conducted in a UV radiation chamber for 5 minutes at 400° C. under a pressure of 665 Pa while introducing $N_2$ at 4,000 sccm, using a UV power of 100 W/cm.

Direct plasma treatment was conducted for 10 minutes in the same reaction chamber as film deposition, after the UV-curing, under the following conditions:

Temperature of Substrate: 250° C.;
Pressure: 40 Pa;
Hydrogen Gas Flow: 300 sccm;
RF Power (13.56 MHz): 400 W;
Distance between the showerhead and the susceptor: 8 mm.

Figure 3:
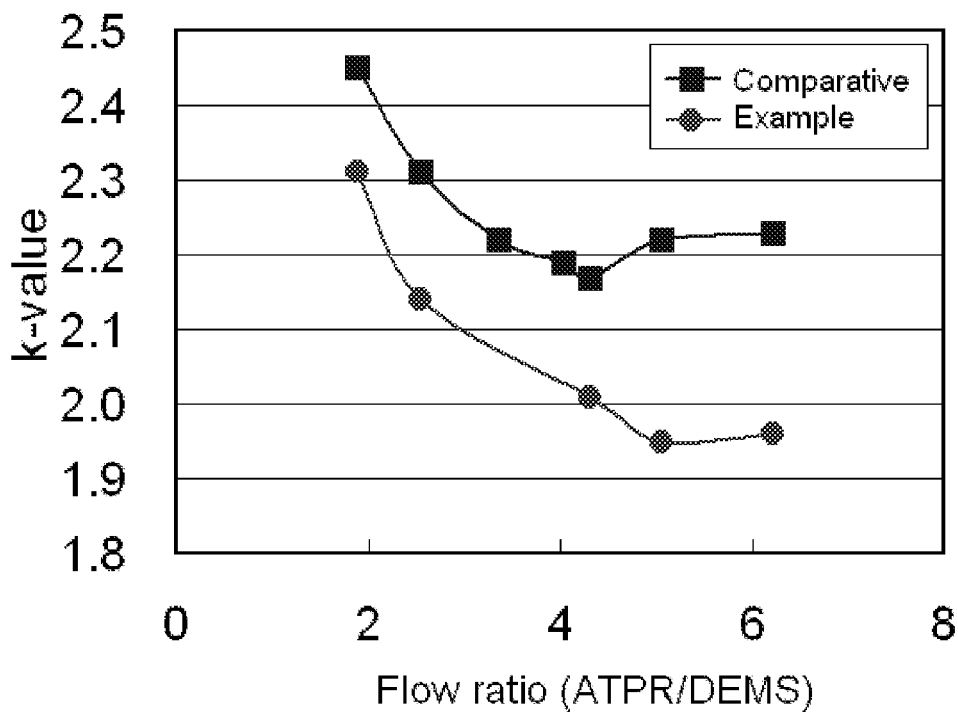
FIG. 3 is a graph illustrating the relationship between k-value and flow ratio according to an embodiment of the present invention.

As a comparative example, the same processes as above were conducted without the direct plasma treatment. The dielectric constant of resultant films was measured as a function of flow ratio (ATPR/DEMS), and the results are shown in FIG. 3. As shown in FIG. 3, by conducting the direct plasma treatment, the dielectric constant of films can significantly be reduced. When the flow ratio is 4 or greater, the dielectric constant can be about 2.0 or less.

Example 2

Using an apparatus for plasma enhanced CVD illustrated in FIG. 1, a film having a thickness of 250 nm was deposited on a 200-mm wafer under the following conditions:
Temperature: 250° C.;
Pressure: 800 Pa;
He: 900 sccm;
$O_2$: 25 sccm;
DEMS: 105.1 sccm;
ATPR: 263.1 sccm;
HRF: 1,000 W;
Distance between the showerhead and the susceptor: 8 mm.

UV-curing was conducted in a UV radiation chamber for 5 minutes at 400° C. under a pressure of 665 Pa while introducing $N_2$ at 4,000 sccm, using a UV power of 100 W/cm.

Direct plasma treatment was conducted for 10 minutes in the same reaction chamber as film deposition, after the UV-curing, under the following conditions:

Temperature of Substrate: 250° C.;
Pressure: 30 Pa;
Hydrogen Gas Flow: 100 sccm;
RF Power (13.56 MHz): 100 W;
Distance between the showerhead and the susceptor: 11 mm.

Figure 4:
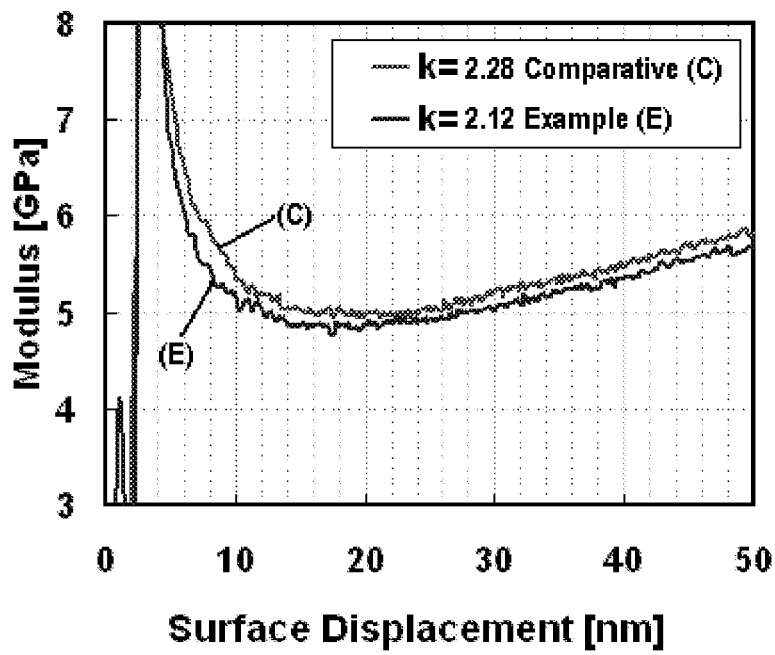
FIG. 4 is a graph illustrating the relationship between elastic modulus and surface displacement according to an embodiment of the present invention.

The dielectric constant of a film upon the UV-curing was 2.28, and it was reduced to 2.12 after the direct plasma treatment. The elastic modulus of the film upon the UV-curing was 5.0 GPa, and it was substantially unchanged after the direct plasma treatment. FIG. 4 is a graph showing elastic modulus as a function of surface displacement. The leakage current of the film upon the UV-curing was 3.4 E-8 $A/cm^2$, and it was reduced to 2.2 E-9 $A/cm^2$. Further, the porosity of the film upon the UV-curing was 29%, and it was increased to 35%. As a comparative example, the same processes as above were conducted without the direct plasma treatment. FIG. 4 also shows elastic modulus of the film without the direct plasma treatment as a function of surface displacement. It shows that the direct plasma treatment did not substantially change the elastic modulus of the film.

Examples 3 and 4

The same processes were conducted as in Example 2 except the conditions shown in Table 1 below:

TABLE 1

| Ex. | Temperature [° C.] | Pressure [Pa] | $H_2$ Flow [sccm] | RF power [W] | Gap [mm] | k-value | IV [A/cm$^2$] | $H_2$ plasma treatment |
|---|---|---|---|---|---|---|---|---|
| 2 | 250 | 30 | 100 | 100 | 11 | 2.28→2.12 | 3.4E−8→2.2E−9 | Post-UV |
| 3 | 250 | 30 | 100 | 100 | 11 | 2.41→2.31 | 1.2E08→3.8E−9 | Post-UV |
| 4 | 250 | 50 | 200 | 400 | 8 | 2.17→1.96 | 1.3E−8→1E−9 | Pre-UV |

As shown in Table 1, in Examples 2-4, the dielectric constant of the films were reduced by at least 0.1, and the leakage current was reduced nearly by one digit.

Example 5

Using an apparatus for plasma enhanced CVD illustrated in FIG. 1, a film having a thickness of 255 nm was deposited on a 200-mm wafer under the following conditions:
Temperature: 245° C.;
Pressure: 800 Pa;
He: 900 sccm;
$O_2$: 25 sccm;
DEMS: 105.1 sccm;
ATPR: 263.1 sccm;
HRF: 1,000 W;
Distance between the showerhead and the susceptor: 8 mm.

UV-curing was conducted in a UV radiation chamber for 6 minutes at 400° C. under a pressure of 665 Pa while introducing $N_2$ at 4,000 sccm, using a UV power of 100 W/cm.

Direct plasma treatment was conducted for 10 minutes in the same reaction chamber as film deposition, before the UV-curing, under the following conditions:
Temperature of Substrate: 250° C.;
Pressure: 30 Pa;
Hydrogen Gas Flow: 100 sccm;
RF Power (13.56 MHz): 100 W;
Distance between the showerhead and the susceptor: 11 mm.

The dielectric constant of a film upon the film deposition was 2.66, and it was reduced to 2.32 after the direct plasma treatment. The dielectric constant of the film was unchanged after the UV-curing (it was 2.32). The elastic modulus of the film upon the UV-curing was 8.0 GPa.

Example 6

The same processes as in Example 2 (post UV-curing plasma treatment) were conducted as Example 6, and as a comparative example, in place of the direct plasma treatment using hydrogen, direct plasma treatment using helium was conducted.

Figure 2:
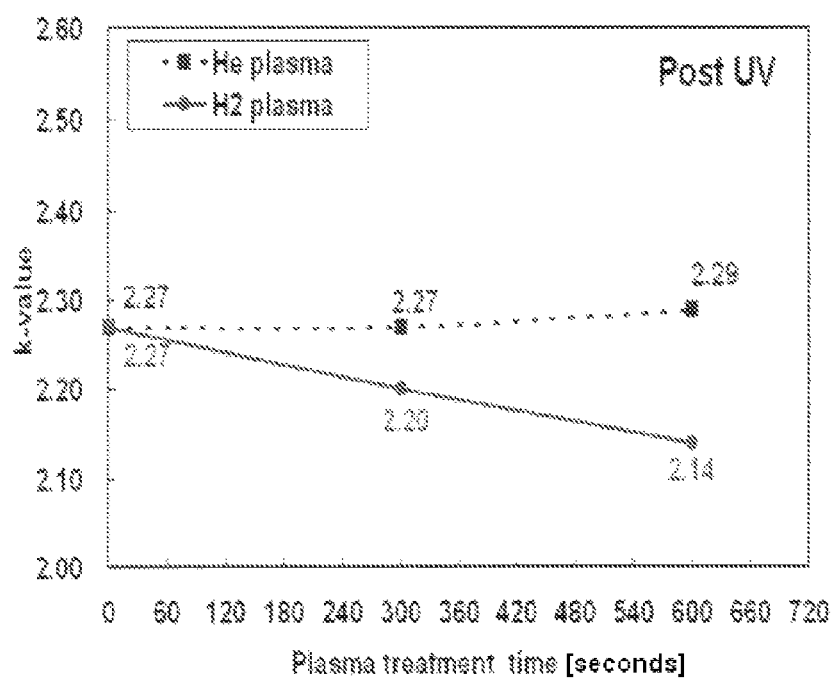
FIG. 2 is a graph illustrating the relationship between k-value (dielectric constant) and plasma treatment time [seconds] according to an embodiment of the present invention.

The results are shown in FIG. 2. A shown in FIG. 2, by using the direct plasma treatment using hydrogen, the dielectric constant can be reduced significantly proportionally to the plasma treatment duration. In contrast, when using the direct plasma using helium, the dielectric constant was not reduced at all.

Example 7

The same processes as in Example 5 (pre UV-curing plasma treatment) were conducted as Example 7, and as a comparative example, in place of the direct plasma treatment, remote plasma treatment was conducted under the following conditions:

Remote Plasma Power: 1200 W;
Hydrogen Gas Flow: 500 sccm;
Inert Gas (Ar) Flow: 5000 sccm;
Temperature of Substrate: 250° C.;
Pressure: 300 Pa;
Duration of Treatment: 900 Seconds.

The results are shown in Table 2 ("As-depo" refers to a film as deposited, "UV-cure" refers to a UV-cured film, "RI" refers to reflective index). A shown in Table 2, by using the direct plasma treatment, the dielectric constant can be reduced more significantly than by the remote plasma treatment.

TABLE 2

| | Item | | Pre-UV Direct plasma | Pre-UV Remote plasma |
|---|---|---|---|---|
| As-depo | Thickness | [nm] | 248.9 | 264.3 |
| | RI | [—] | 1.474 | 1.476 |
| UV-cure | Thickness | [nm] | 198.2 | 218.3 |
| | RI | [—] | 1.27 | 1.29 |
| | k-value | [—] | 2.03 | 2.15 |
| | Shrinkage | [%] | 20.3 | 17.4 |

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for reducing a dielectric constant of a film, comprising (i) forming a dielectric film on a substrate; (ii) treating a surface of the film without film formation, and (III) curing the film, wherein:
    step (i) comprises forming a dielectric film containing a porous matrix and a porogen on a substrate using capacitively-coupled electrodes,
    step (ii) comprises, prior to step (iii), treating the dielectric film with charged species of hydrogen generated by plasma without film deposition so as to remove a porogen weakly coupled with a film matrix of the dielectric film and inhibit aggregation of a porogen in the film matrix, said plasma being generated using the capacitively-coupled electrodes, said charged species of hydrogen containing both excited hydrogen radicals and hydrogen ions, and
    step (iii) comprises UV-curing the dielectric film to remove at least partially the porogen from the film.

2. The method according to claim 1, wherein the charged species of hydrogen is comprised predominantly of excited hydrogen radicals and hydrogen ions.

3. The method according to claim 2, wherein in step (ii), no species generated in a remote plasma unit are used for treating the dielectric film.

4. The method according to claim 2, wherein the charged species of hydrogen is generated from a reducing gas containing hydrogen supplied over the dielectric film, to which hydrogen gas RF power is applied in-situ.

5. The method according to claim 4, wherein the RF power is about 0.7 W/cm² or less per area of the substrate at a temperature of about 200° C. to about 250° C. under a pressure of about 20 Pa to about 200 Pa.

6. The method according to claim 5, wherein the reducing gas is hydrogen gas.

7. The method according to claim 1, wherein step (i) and step (ii) are continuously conducted without breaking vacuum.

8. The method according to claim 1, wherein the dielectric film has a thickness of 200 nm or more prior to steps (ii) and (iii).

9. The method according to claim 1, wherein the step of providing the dielectric film containing the porous matrix and the porogen comprises supplying a porogen gas and a precursor gas at a ratio of about 2 to about 6 of porogen gas flow to precursor gas flow, and depositing a film on the substrate by plasma CVD.

10. The method according to claim 9, wherein the precursor gas comprises a silicon-containing gas, and the porogen gas comprises a hydrocarbon gas.

11. The method according to claim 1, wherein the step of treating the dielectric film with charged species of hydrogen generated by capacitively-coupled plasma is the only step in step (ii).

12. The method according to claim 1, wherein after steps (i) to (iii), the dielectric film has a dielectric constant of 2.15 or lower.

13. The method according to claim 1, wherein a dielectric constant of the dielectric film is decreased by at least 0.1 as a result of conducting step (ii).

14. The method according to claim 1, wherein an elastic modulus of the dielectric film remains substantially unchanged as a result of conducting step (ii).

15. The method according to claim 1, wherein step (i) and step (ii) are conducted in the same reaction chamber.

16. The method according to claim 9, wherein a distance between electrodes for generating the plasma in step (ii) is greater than that in step (i).

* * * * *